(12) United States Patent
Dasgupta et al.

(10) Patent No.: US 11,705,197 B2
(45) Date of Patent: *Jul. 18, 2023

(54) MODIFIED WRITE VOLTAGE FOR MEMORY DEVICES

(71) Applicant: Micron Technology, Inc., Boise, ID (US)

(72) Inventors: Sandeepan Dasgupta, Albuquerque, NM (US); Sanjay Rangan, Albuquerque, NM (US); Koushik Banerjee, Milpitas, CA (US); Nevil Gajera, Meridian, ID (US); Mase J. Taub, Folsom, CA (US); Kiran Pangal, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/501,553

(22) Filed: Oct. 14, 2021

(65) Prior Publication Data

US 2022/0068385 A1 Mar. 3, 2022

Related U.S. Application Data

(63) Continuation of application No. 16/809,453, filed on Mar. 4, 2020, now Pat. No. 11,170,853.

(51) Int. Cl.
*G11C 7/10* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0061* (2013.01); *G11C 2013/0078* (2013.01)

(58) Field of Classification Search
CPC . G11C 13/0069; G11C 13/003; G11C 13/004; G11C 13/0061
(Continued)

(56) References Cited

U.S. PATENT DOCUMENTS 8,248,866 B2 * 8/2012 Ishizaki ................. G11C 7/10
365/230.01
9,779,017 B2 10/2017 Wang et al.
(Continued)

FOREIGN PATENT DOCUMENTS

JP 2017-045493 A 3/2017
JP 2019117680 A 7/2019
(Continued)

OTHER PUBLICATIONS

ISA/KR International Search Report and Written Opinion of the International Searching Authority, Int'l. Appl. No. PCT/US2021/017172, dated May 25, 2021, Seo-gu, Daejeon, Republic of Korea, 10 pgs.
(Continued)

*Primary Examiner* — Vu A Le
(74) *Attorney, Agent, or Firm* — Holland & Hart LLP

(57) ABSTRACT

Methods, systems, and devices for a modified write voltage for memory devices are described. In an example, the memory device may determine a first set of memory cells to be switched from a first logic state (e.g., a SET state) to a second logic state (e.g., a RESET state) based on a received write command. The memory device may perform a read operation to determine a subset of the first set of memory cells (e.g., a second set of memory cells) having a conductance threshold satisfying a criteria based on a predicted drift of the memory cells. The memory device may apply a RESET pulse to each of the memory cells within the first set of memory cells, where the RESET pulse applied to the
(Continued)

second set of memory cells is modified to decrease voltage threshold drift in the RESET state.

20 Claims, 9 Drawing Sheets

(58) Field of Classification Search
USPC .................................................. 365/189.16
See application file for complete search history.

(56) References Cited

U.S. PATENT DOCUMENTS

| | | |
|---|---|---|
| 2012/0033480 A1 | 2/2012 | Hosono et al. |
| 2014/0059268 A1 | 2/2014 | Adachi et al. |
| 2015/0287460 A1 | 10/2015 | Lee et al. |
| 2015/0325289 A1 | 11/2015 | Castro |
| 2017/0125097 A1 | 5/2017 | Tortorelli et al. |
| 2017/0256313 A1 | 9/2017 | Katayama |
| 2017/0293513 A1 | 10/2017 | Shinbashi et al. |
| 2018/0122472 A1 | 5/2018 | Pirovano et al. |
| 2018/0336139 A1* | 11/2018 | Rao ..................... G11C 16/105 |
| 2019/0080782 A1 | 3/2019 | Mariani et al. |
| 2019/0122718 A1 | 4/2019 | Vimercati |

FOREIGN PATENT DOCUMENTS

| | | |
|---|---|---|
| KR | 20170096152 A | 8/2017 |
| KR | 10-2019-0060006 A | 5/2019 |
| KR | 10-2019-0136138 A | 12/2019 |
| KR | 10-2020-0003946 A | 1/2020 |

OTHER PUBLICATIONS

Korean Patent Office, "Notice of Allowance," issued in connection with Korean Patent Application No. 10-2022-7033724 dated Nov. 15, 2022 (10 pages).

Japan Patent Office, "Office Action," issued in connection with Japan Patent Application No. 2022-552695 dated Jan. 24, 2023 (5 pages) (2 pages of English Translation and 3 pages of Original Document).

* cited by examiner

MODIFIED WRITE VOLTAGE FOR MEMORY DEVICES

CROSS REFERENCE

The present application for patent is a continuation of U.S. patent application Ser. No. 16/809,453 by Dasgupta et al., entitled "MODIFIED WRITE VOLTAGE FOR MEMORY DEVICES," filed Mar. 4, 2020, which is assigned to the assignee hereof, and expressly incorporated by reference in its entirety herein.

BACKGROUND

The following relates generally to a system that includes at least one memory device and more specifically to modified write voltage for memory devices.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices may include increasing memory cell density, increasing read/write speeds, increasing reliability, increasing data retention, reducing power consumption, or reducing manufacturing costs, among other metrics. In some applications, material characteristics or responsive behaviors of memory cells may change overtime, which may affect performance of a memory device.

DETAILED DESCRIPTION

Figure 1:
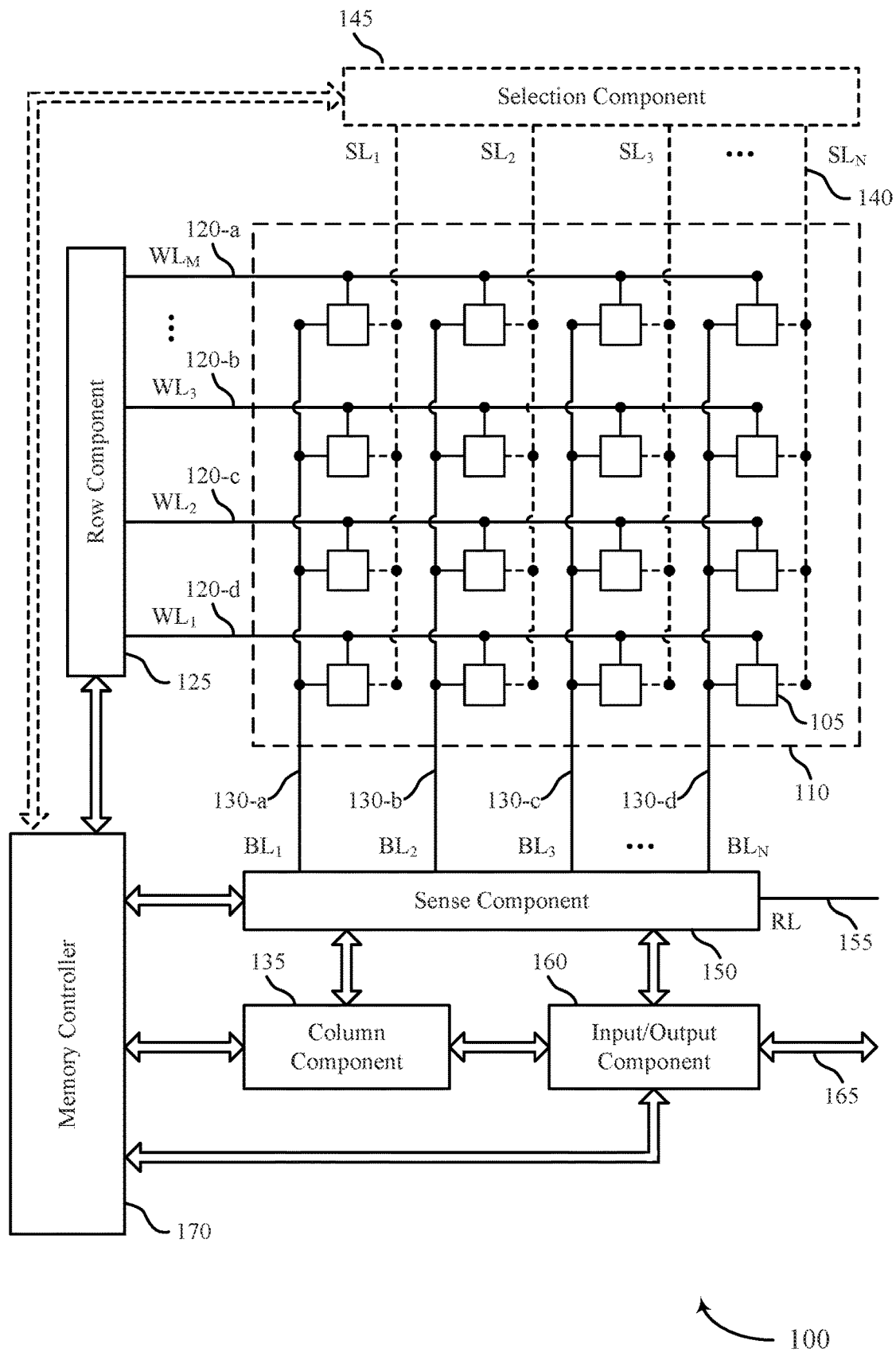
FIG. 1 illustrates an example of a memory device that supports modified write voltage in accordance with examples as disclosed herein.

A memory cell architecture may store a logic state in a configurable material (e.g., in a physical characteristic or property of the material), such as a chalcogenide. For example, different material characteristics or properties of a material may be configurable based on aspects of a write operation, and differences in the material characteristics or properties may be detected during a read operation to distinguish whether a memory cell was written with one logic state or another (e.g., a logic 0 or a logic 1). In some examples, a logic state stored by a configurable material may be based at least in part on a polarity of a voltage across the configurable material during a write operation. In some examples, a logic state stored by a configurable material may be based at least in part on a direction of current applied through a configurable material during a write operation, or a combination of a polarity of a voltage across the configurable material and a direction of current applied through a configurable material during a write operation.

The polarity used for programming may be accompanied by a particular behavior or characteristic of a configurable material, such as a threshold voltage of the material, which may be used to detect a logic state stored by the memory cell (e.g., in a read operation). For example, one polarity of a write operation may be associated with a relatively high threshold voltage of the configurable material (e.g., for a particular read operation, for a particular read voltage) and a first logic state (e.g., a SET state). Additionally or alternatively, another polarity of a write operation may be associated with a relatively low threshold voltage of the configurable material (e.g., for the particular read operation, for the particular read voltage) and a second logic state (e.g., a RESET state). In such examples, a presence or absence of current through the material in response to a read voltage applied across the material may be used to determine (e.g., distinguish) whether the memory cell was written with one polarity or another, thereby providing an indication of the logic state that was written to the memory cell.

In some memory applications, material characteristics, material properties, or responsive behaviors of a configurable material may change or drift overtime (e.g., due to aging, wear, degradation, compositional changes or migrations, changes in operating conditions such as temperature, or other changes). For example, as a configurable material accumulates access operations (e.g., write operations, read operations, cycles), the response of the configurable material to a given write operation may change. In one example, as a configurable material accumulates access operations, a programmed threshold voltage may migrate (e.g., increase or decrease) in response to a given write operation (e.g., a write operation according to a particular pulse amplitude and particular pulse duration). Additionally or alternatively, when a temperature of a configurable material changes, a programmed threshold voltage in response to a given write operation may drift. Moreover, threshold voltages may drift differently for each memory cell of a set of memory cells, which may be accompanied by various changes to an average threshold voltage of the set of memory cells (e.g., corresponding to a particular logic state), various changes to a standard deviation or other distribution of threshold voltages of the set of memory cells (e.g., corresponding to the particular logic state), or various other characteristics or combinations of characteristics of threshold voltage distributions (e.g., statistical distributions).

The threshold voltage drift of a memory cell may increase as the time since the last programming operation of the memory cell increases. For example, a memory cell programmed one second ago may exhibit less voltage drift than a memory cell programmed ten seconds ago. Additionally, a memory cell programmed to a RESET state may drift more than a memory cell programmed to a SET state. Such voltage drifts, particularly in the RESET state, may increase the voltage necessary to reprogram a memory cell. For example, a memory device reprogramming a memory cell from a RESET state to a SET state that is associated with a large voltage drift in the RESET state may apply large access voltages to reprogram the memory cell. Thus, it may be desirable to reduce voltage drift to improve power consumption metrics associated with the memory device.

In accordance with aspects of the present disclosure, a write operation for writing memory cells from a first logic state (e.g., a SET logic state) to a second logic state (e.g., a RESET logic state) may be modified to decrease a threshold voltage drift (e.g., a threshold voltage migration) of the memory cells while in the second logic state. In some cases, there may be a correlation between a threshold voltage drift of a memory cell in a SET state and a threshold voltage drift of the memory cell in a RESET state. For example, a memory cell that has a large threshold voltage drift in the SET state may be more likely to have a similarly large (or, in some cases, disproportionally large) threshold voltage drift in the RESET state. A memory device may predict whether a memory cell to be written from the SET state to the RESET state will have a large threshold voltage drift in the RESET state based on a determined threshold voltage drift in the SET state. If the memory device determines that the memory cell will likely have a large threshold voltage drift in the RESET state (e.g., based on determining that the memory cell has a large voltage drift in the SET state), the memory device may apply a modified write signal to write the memory cell from the SET state to the RESET state. Tc modified write signal may decrease a magnitude of the threshold voltage drift of the memory cell in the RESET state.

When a memory device receives a write command, the memory device may determine memory cells that are to be written to a RESET state based on the data indicated by the write command. The memory device may then perform a read operation (e.g., a pre-program read operation) to determine a first set of memory cells currently in a SET state and to be written to the RESET state and to determine a second set of memory cells (e.g., within the first set of memory cells) that are associated with a large voltage drift in the SET state. The memory device may then apply write signals to each of the memory cells within the first set of memory cells to write the memory cells to a RESET state (e.g., not applying write signals to those memory cells already in the RESET state). The memory device may apply a standard write signal to the memory cells within the first set of memory cells that have a threshold voltage that failed to meet the criteria (e.g., are not associated with a large voltage drift in the SET state). Additionally or alternatively, the memory device may apply a modified write signal to the memory cells within the second set of memory cells that have a threshold voltage that meet the criteria (e.g., are associated with a large voltage drift in the SET state). The modified write signal may decrease a likelihood that the memory cell exhibits a large voltage drift within the RESET state.

Features of the disclosure are initially described in the context of a memory system and memory die as described with reference to FIG. 1. Features of the disclosure are further described in the context of voltage threshold distributions, a system, a process flow, and signal pulses with reference to FIGS. 2-6. These and other features of the disclosure are further illustrated by and described with reference to an apparatus diagram and flowcharts that relate to modified write voltage for memory devices as described with references to FIGS. 7-9.

FIG. 1 illustrates an example of a memory device 100 that supports a modified write voltage in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, which may be denoted as a logic 0 and a logic 1. In some cases, a memory cell 105 may be programmable to store more than two logic states. In the example of memory device 100, different logic states may be programmed by writing memory cells 105 having configurable material characteristics or material properties that correspond to different logic states, where such material characteristics or material properties (e.g., material states) may be detected during a subsequent read operation to identify a stored logic state.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip), or a set or bank of more than one contiguous tile of memory cells 105. In some examples, a memory section 110 or a memory tile may refer to the smallest set of memory cells 105 that may be biased in an access operation, or a smallest set of memory cells 105 that share a common node (e.g., a common source node, a common source plate, a set of source lines that are biased to a common voltage). Although a single memory section 110 of the memory device 100 is shown, various examples of a memory device in accordance with the present disclosure may have multiple memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In the example of memory device 100, a memory cell 105 may include or otherwise be associated with a configurable material, which may be referred to as a memory element, a memory storage element, a material element, a material memory element, a material portion, a polarity-written material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material.

In some examples, a characteristic or property of such a material may be configurable based at least in part on a polarity of a voltage (e.g., an orientation of an electric field) across the material during a write operation. For example, the configurable material may be associated with different electrical resistances or threshold characteristics depending on a polarity of a voltage during the write operation. In one example, a state of the configurable material after a write operation with a negative voltage polarity may have a relatively low electrical resistance or threshold voltage (e.g., corresponding to a "SET" material state, which may correspond to a logic 0), whereas a state of the material after a write operation with a positive voltage polarity may have a relatively high electrical resistance or threshold voltage (e.g., corresponding to a "RESET" material state, which may correspond to a logic 1). In some cases, a relatively high or low resistance or threshold voltage of a written memory cell 105 may be associated with or be otherwise based at least in part on a polarity of a voltage applied during a read operation. For example, a configurable material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a configurable material of a memory cell 105 may be associated with a threshold voltage, which may depend on the polarity of a write operation. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with a positive polarity or a negative polarity. Accordingly, the magnitude of current, or other characteristic (e.g., thresholding behavior, resistance breakdown behavior, snapback behavior) associated with the current, that results from applying a read voltage to the memory cell 105 may be used to determine a logic state stored by memory cell 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a bit line (BL), such as one of $BL_1$ through $BL_N$). The plurality of first access lines 120 may be coupled with a row component 125, which may control various operations such as activating or biasing one or more of the plurality of first access lines 120, or selectively coupling one or more of the plurality of first access lines 120 with a voltage source, current source, or other circuit element. The plurality of second access lines 130 may be coupled with a sense component 150, which may support the detection of logic states stored by memory cells 105. In some examples, a sense component 150 may be in communication with a column component 135, or may include or be otherwise co-located with a column component 135, where a column component 135 may control various operations such as activating or biasing one or more of the plurality of second access lines 130, or selectively coupling one or more of the plurality of second access lines 130 with a voltage source, current source, or other circuit element. In some cases, first access lines 120 and second access lines 130 may be substantially perpendicular to one another in the memory device 100 (e.g., when viewing a plane of a deck, layer, or level of the memory device 100, as shown in FIG. 1). References to word lines and bit lines, or their analogues, are interchangeable without loss of understanding or operation.

In general, one memory cell 105 may be located at the intersection of (e.g., coupled with, coupled between) a first access line 120 and a second access line 130. This intersection, or an indication of this intersection, may be referred to as an address of a memory cell 105. A target or selected memory cell 105 may be a memory cell 105 located at the intersection of a biased or otherwise selected first access line 120 and a biased or otherwise selected second access line 130. In other words, a first access line 120 and a second access line 130 may be biased or otherwise selected to access (e.g., read, write, rewrite, refresh) a memory cell 105 at their intersection. Other memory cells 105 that are not at the intersection of a target memory cell 105 may be referred to as non-target or non-selected memory cells 105.

In some examples, the memory cells 105 of the memory section 110 may also be coupled with one of a plurality of third access lines 140 (e.g., a selection line (SL), such as one of $SL_1$ through $SL_N$). The plurality of third access lines 140 may be coupled with a selection component 145, which may control various operations such as activating or biasing one or more of the plurality of third access lines 140, or selectively coupling one or more of the plurality of third access lines 140 with a voltage source, current source, or other circuit element. In some examples, a third access line 140 may be coupled with a cell selection component (e.g., a transistor, a switching component) associated with respective memory cells 105, where such a cell selection component may be configured to selectively couple the memory cell 105 with an associated first access line 120, or associated second access line 130, or selectively permit or suppress current flow through the respective memory cell 105 (e.g., between a first access line 120 and a second access line 130).

Although the plurality of third access lines 140 of the memory device 100 are shown as being parallel with the plurality of second access lines 130, in other examples, a plurality of third access lines 140 may be parallel with the plurality of first access lines 120, or in any other configuration. For example, in the example of memory device 100, each of the third access lines 140 may correspond to a respective one of the second access lines 130. In another example, each of the third access lines 140 may correspond to a respective one of the first access lines 120. In another example, cell selection operations (e.g., biasing a cell selection line, activating cell selection components of one or more memory cells 105), where implemented, may be performed or otherwise supported by the row component 125 (e.g., for selecting or activating cell selection components of a row or page of memory cells 105), and the selection component 145 may be replaced by, or otherwise perform operations related to a source driver for biasing third access lines 140, which may correspond to individually-controllable source lines, a common source plate, or a common source node.

In other examples, the third access lines 140 and the selection component 145 may be omitted from a memory device 100, and accessing memory cells 105 may rely on self-selecting properties of the memory cells 105. For example, the row component 125 and the column component 135 may support fully-decoded operations, where each of the first access lines 120 and each of the second access lines 130 may be individually biased (e.g., in a cross-point configuration). In such examples, accessing memory cells 105 may rely on a self-selecting characteristic of a target memory cell 105 that may be activated based on a voltage, between an activated first access line 120 and activated second access line 130 associated with the target memory cell 105, exceeding a threshold voltage. In various examples, such a self-selecting characteristic may be supported by the logic-storing configurable material element of a memory cell 105, or may be supported by a material portion of a memory cell 105 that is different from a logic-storing portion (e.g., an ovonic threshold switching portion separate from a logic-storing portion).

In some examples, a first access line 120 may provide access to one area (e.g., one side, one end) of the configurable material portion of a memory cell 105, and a second access line 130 may provide access to another area (e.g., a different side, an opposite side, an opposite end) of the configurable material portion of the memory cell 105. For example, first access lines 120 may be located above the memory cells 105 (e.g., relative to a substrate) and second access lines 130 may be located below the memory cells 105 (e.g., relative to the substrate), or vice versa. Thus, a first access line 120 and a second access line 130 may support applying voltage or current across a configurable material portion of a memory cell 105 with different polarities (e.g., a first polarity when a voltage of a first access line 120 is higher than a voltage of a second access line 130, a second polarity when a voltage of a first access line 120 is lower than a voltage of a second access line 130). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 (e.g., where present) that are coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, silicon (e.g., polycrystalline or amorphous) or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a configurable material portion storing a logic state may be read by applying a read voltage or bias across the memory cell 105, and the resulting flow of current via an access line (e.g., via a second access line 130), or lack thereof, or other characteristic of current flow may be detected, converted, or amplified to determine the programmed logic state stored by the memory cell 105.

Accessing memory cells 105 may be controlled through a row component 125 (e.g., a row decoder), a column component 135 (e.g., a column decoder), or a selection component 145 (e.g., a cell selection driver or a source driver, when included in a memory device 100), or a combination thereof. For example, a row component 125 may receive a row address from the memory controller 170 and select, activate, or bias the appropriate first access line 120 based on the received row address. Similarly, a column component 135 may receive a column address from the memory controller 170 and select, activate, or bias the appropriate second access line 130. Thus, in some examples, a memory cell 105 may be accessed by selecting or activating a first access line 120 and a second access line 130. In various examples, any one or more of the row component 125, the column component 135, or the selection component 145 may be referred to as, or otherwise include access line drivers, access line decoders, access line multiplexers, or other circuitry.

In some examples, the memory controller 170 may control the operation (e.g., read operations, write operations, rewrite operations, refresh operations) of memory cells 105 through the various components (e.g., a row component 125, a column component 135, selection component 145, a sense component 150). In some cases, one or more of a row component 125, a column component 135, a selection component 145, or a sense component 150 may be co-located or otherwise considered to be included with the memory controller 170. In some examples, one or more of a row component 125, a column component 135, or the sense component 150 may be otherwise co-located (e.g., in common circuitry, in a common portion of the memory device 100). In some examples, any one or more of a row component 125, a column component 135, or a selection component 145 may be referred to as a memory controller or circuitry for performing access operations of the memory device 100. In some examples, any one or more of a row component 125, a column component 135, or a selection component 145 may be described as controlling or performing operations for accessing a memory device 100, or controlling or performing operations for accessing the memory section 110 of the memory device 100.

The memory controller 170 may generate row and column address signals to activate a target first access line 120 and a target second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single selection component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110.

A configurable material of a memory cell 105 may be set, written, or refreshed by biasing various combinations of the associated first access line 120, second access line 130, or third access line 140 (e.g., via a memory controller 170). In other words, a logic state may be stored in the configurable material of a memory cell 105 (e.g., via a cell access signal, via a cell write signal). A row component 125, a column component 135, or a selection component 145 may accept data, for example, via input/output component 160, to be written to the memory cells 105. In some examples, a write operation may be performed at least in part by a sense component 150, or a write operation may be configured to bypass a sense component 150 (e.g., being performed by a column component 135). The configurable material of a memory cell 105 may be written with a logic state that is based at least in part on a polarity of a write voltage across the memory cell 105, which, in some examples, may be accompanied by a write current (e.g., based at least in part on the write voltage, driven by a current source).

During a write operation, the memory controller 170 may activate a target word line 120 and a target bit line 130 to access the target memory cell 105. For example, the memory controller 170 may apply a voltage to word line 120-c and bit line 130-b to active the memory cell 105 coupled with word line 120-c and bit line 130-b. In some cases, in order to write data the memory cell 105, a voltage applied across the memory cell 105 (e.g., a voltage difference between the word line 120 and the bit line 130) may exceed a threshold voltage of the memory cell 105. For example, the memory controller 170 may apply a write signal to a memory cell 105 with a voltage level that is higher (e.g., substantially higher) than the threshold voltage of the memory cell 105 to set the memory cell 105 to a certain state (e.g., a SET state, a RESET state). To apply the write signal, the row component 125 may apply a first component signal to a word line 120 of a first polarity and the column component 135 may apply a second component signal to a bit line 130 of a second polarity. Thus, the voltage difference across a targeted memory cell 105 may correspond to a difference between the first component signal on a word line 120 and a second component signal on a bit line 130. As a result, the magnitude of each voltage (e.g., of the first and second component signals) may be less than the threshold voltage of the memory cell 105. Thus, each of the other memory cells 105 coupled to one of the targeted word line 120 (e.g., but not the targeted bit line 130) or the targeted bit line 130 (e.g., but not the targeted word line 120) may be subject to a voltage that is less than their associated threshold voltage.

In some cases, if a threshold voltage of a memory cell 105 is large, the memory controller 170 may apply a proportionally larger write signal to the memory cell 105 to write the memory cell 105 from a first logic state (e.g., a SET state, a RESET state) to a second logic state. For example, a memory cell 105 may have a relatively higher threshold voltage when in a RESET state. Therefore, in order to reprogram the memory cell 105 to the SET state, the memory controller 170 may apply a larger write signal to the memory cell 105 when compared to programming a memory cell 105 from a SET state to a RESET state. The memory cell 105 may experience a voltage threshold drift in the RESET state that further increases its threshold voltage in the RESET state. As a magnitude of a voltage associated with a write signal increases, the margin between the voltage applied to each word line 120 and bit line 130 and the voltage thresholds of memory cells 105 that are not targeted decreases. In some cases, in order to apply a write signal that exceeds the threshold voltage of a target memory cell 105, each of the component signals may be near to or larger than a threshold voltage of other memory cells 105 coupled with the word lines 120 or bit lines 130.

The memory controller 170 may apply third and fourth component signals to the word lines 120 and the bit lines 130 to decrease a voltage difference applied to memory cells 105 that are not targeted by a write operation. For example, if a row component 125 applies a first component signal to word line 120-a and a column component 135 applies a second component signal to bit line 130-d to perform a write operation on a target memory cell 105 coupled with the word line 120-a and the bit line 130-d, other non-target memory cells 105 coupled to one of the word line 120-a or the bit line 130-d may have a voltage across the memory cell 105 equal to a magnitude of the first or second component signals. In order to decrease the magnitude of the voltage across the non-target memory cells, the row component 125 may apply a third component signal to each of the word lines 120-b, 120-c, and 120-d of the same polarity as the second component signal applied to the bit line 130-d. Thus, the magnitude of the voltage across memory cells coupled with the bit line 130-d may be decreased. Similarly, the column component 135 may apply a fourth component signal to each of the bit lines 130-a, 130-b, and 130-c of the same polarity as the first component signal applied to the word line 120-a. Thus, the magnitude of the voltage across memory cells coupled with the word line 120-a may be decreased. Because the memory device 100 applies voltages across cells that are not on the target word line 120 and/or on the target bit line 130 which may result in some subthreshold (e.g., leakage) current, performing a write operation on a memory cell 105 associated with a high threshold voltage may utilize a large amount of power. It may be desirable to decrease threshold voltage drift (e.g., in a RESET state) to increase the power efficiency of the memory device 100.

A configurable material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the configurable material portion of a memory cell 105 may or may not permit electrical charge or current to flow via its corresponding access lines 120 or 130 (e.g., in response to a read voltage). Such charge or current may result from biasing, or applying a voltage, to the memory cell 105 from one or more voltage sources or supplies (not shown) of the memory device 100, where voltage sources or supplies may be part of a row component 125, a column component 135, a sense component 150, a memory controller 170, or some other component (e.g., a biasing component). In some examples (e.g., in a memory architecture that includes cell selection components), the described biasing may be supported by an activation of a cell selection component of a target memory cell 105, a deactivation of a cell selection component of a non-target memory cell 105, or both.

In some examples, when a read bias (e.g., a read pulse, a read current, a read voltage) is applied across a memory cell 105 with a configurable material storing a first logic state (e.g., a "SET" material state, associated with a first write polarity), the memory cell 105 may conduct current due to the read bias exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read bias is applied to the memory cell 105 with the configurable material storing a second logic state (e.g., a "RESET" material state, associated with a second write polarity different than the first write polarity), the memory cell 105 may not conduct current due to the read bias not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read bias, but equal to or below an expected current through the memory cell 105 when the memory cell 105 does threshold in response to the read bias. For example, the reference current may be higher than a leakage current of the associated access lines 120 or 130 (e.g., higher than a leakage current associated with one or more memory cells 105 coupled with an access line 120 or 130 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage or current may be applied when reading a memory cell 105 or set of memory cells 105 (e.g., multiple voltages may be applied during portions of a read operation). For example, if an applied read voltage does not result in current flow, or a threshold quantity of memory cells 105 being activated, one or more other read voltages or voltage polarities may be applied (e.g., until a current is detected by sense component 150, based at least in part on a threshold quantity of memory cells 105 being activated). Based at least in part on assessing the read voltage that resulted in current flow, the stored logic state of the memory cell 105 may be determined. In some cases, a read voltage or current may be ramped (e.g., smoothly increasing higher in magnitude) or stepped (e.g., increasing by discrete amounts according to discrete intervals) until a current flow or other condition is detected by a sense component 150 or memory controller 170. In other cases, predetermined read voltages may be applied (e.g., a predetermined sequence of read voltages that increase higher in magnitude in a stepwise manner, a predetermined sequence of read voltages that include different read voltage polarities) until a current is detected, or otherwise based on a quantity of memory cell activations. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, current sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120 or 130 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a configurable material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a configurable material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain or rewrite stored logic states. Refreshing a memory cell 105 may reduce or eliminate read disturb errors or logic state corruption due to a change in the material state of a configurable logic storage material over time.

In some cases, material characteristics, material properties, or responsive behaviors of a configurable material associated with the memory cells 105 may change or migrate over time (e.g., due to aging, wear, degradation, compositional changes or migrations, operating temperatures, or other changes). For example, as a configurable material of a memory cell 105 accumulates access operations (e.g., write operations, read operations), the response of the memory cell 105 to a given write operation or read operation may change. In one example, as a configurable material accumulates access operations, a programmed threshold voltage of the memory cell 105 may migrate in response to a given write operation (e.g., a write operation according to a pulse amplitude and pulse duration, a write operation corresponding to a particular logic state). Threshold voltages may migrate differently for each memory cell 105 of a set of memory cells 105 (e.g., a column of memory cells 105, a row of memory cells 105, memory cells 105 of a memory section 110), which may be accompanied by various changes to an average threshold voltage of the set of memory cells 105 (e.g., corresponding to a particular logic state), various changes to a standard deviation of threshold voltages of the set of memory cells (e.g., corresponding to the particular logic state), or various other characteristics or combinations of characteristics of threshold voltage distributions (e.g., statistical distributions).

Accordingly, examples of the described techniques may be used to decrease changes or migrations of material characteristics or responsive behaviors of a configurable material used to store information in the memory device 100, which may improve the performance of a memory device 100 compared to other memory devices that do not compensate for such changes.

Figure 2:
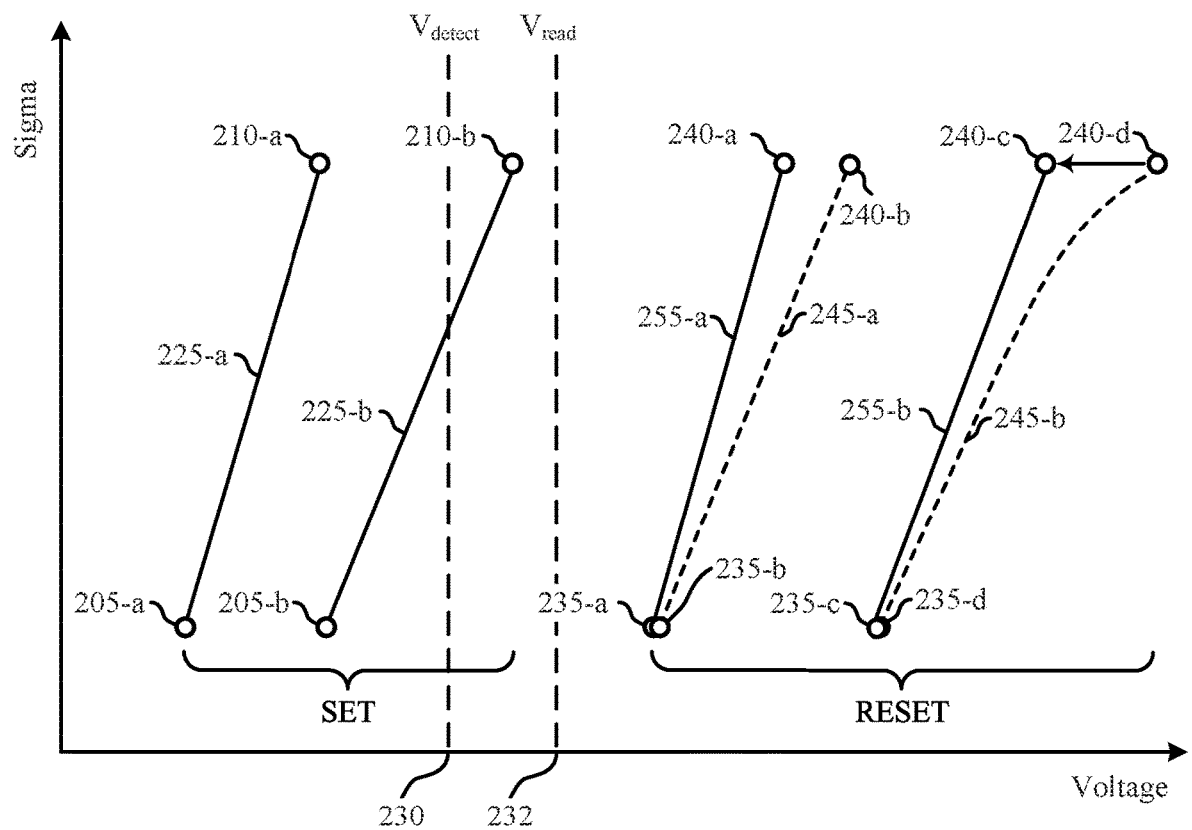
FIG. 2 illustrates a plot of threshold voltage distributions in a memory device that supports modified write voltage in accordance with examples as disclosed herein.

FIG. 2 illustrates a plot 200 of threshold voltage distributions in a memory device that supports a modified write voltage for memory devices in accordance with examples as disclosed herein. The plot 200 may illustrate threshold voltage distributions of a representative population of memory cells (e.g., a representative population of configurable material memory elements) of a memory device 100 with respect to a standard deviation, sigma, or some other probabilistic measure. For illustration purposes, the sigma axis may be a nonlinear axis so that a normal distribution of threshold voltages may be illustrated as linear distributions in the plot 200. In some examples, the distributions of the plot 200 may be referred to as Gaussian distributions.

The distributions 225 may illustrate distributions of threshold voltages for the representative population of memory cells when storing a first logic state or material state (e.g., a "SET" state). Distribution 225-a may illustrate a distribution of threshold voltages at a first time, while distribution 225-b may illustrate a distribution of threshold voltages at a second time. That is, distribution 225-b may illustrate a drifted distribution. For example, distribution 225-a may illustrate the distribution of threshold voltages one (1) microsecond (μs) after programming the memory cells while distribution 225-b may illustrate the distribution of threshold voltages of the memory cells 10-1000 seconds after programming the memory cells.

The distributions 225 may be associated with a lower boundary or edges 205 which may be referred to as "E1." and an upper boundary or edge 210 which may be referred to as "E2." The distributions 225 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the SET state.

The distributions 245 and 255 may illustrate a distribution of threshold voltages for the representative population of memory cells when storing a second logic state or material state (e.g., a "RESET" state). Distributions 245-a and 255-a may illustrate a distributions of threshold voltages at a first time while distributions 245-b and 255-b may illustrate example distributions of threshold voltages at a second time. That is, distributions 245-b and 255-b may illustrate examples of drifted distributions. For example, distributions 245-a and 255-a may illustrate the distributions of threshold voltages one (1) μs after programming the memory cells while distributions 245-b and 255-b illustrate examples of distributions of threshold voltages of the memory cells 10-1000 seconds after programming the memory cells. Further, memory cells associated with large threshold voltages in the RESET state at the first time (e.g., higher than three (3) sigma on distribution 255-a) may be more susceptible to threshold voltage drift than other memory cells associated with smaller threshold voltages in the RESET state.

The distributions 245 and 255 may be associated with a lower boundary or edge 235, which may be referred to as "E3," and an upper boundary or edge 240, which may be referred to as "E4." As is shown with reference to distributions 245-b and 255-b, the threshold voltage drift associated with threshold voltages in the RESET state are greater than the threshold voltage drift associated with the threshold voltages in the SET state. The distributions 255 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the RESET state.

The plot 200 illustrates a read voltage 232 (e.g., a reference voltage) that may be used for detecting or distinguishing respective logic states stored by the representative population of memory cells. For example, referring to the distributions 225 and 255, memory cells of the representative population that store the SET state may permit a flow of current (e.g., a flow of current above a threshold amount of current) when applying the read voltage 232, because the read voltage 232 is above the threshold voltage for each of those memory cells (e.g., because the distributions 225 are below the read voltage 232). In other words, memory cells in the SET state will "threshold" in response to the read voltage 232 being applied. On the other hand, memory cells of the representative population that store the RESET state may not permit a flow of current when applying the read voltage 232, or may permit some flow of current that is below a threshold (e.g., a leakage current) because the read voltage 232 is below the threshold voltage for each of those memory cells (e.g., because the distributions 255 are above the read voltage 232). In other words, memory cells in the RESET state may not threshold in response to the read voltage 232 being applied. Thus, in some examples, the read voltage 232 may be referred to as, or otherwise be associated with a voltage demarcation (VDM), which may refer to a demarcation or other reference voltage or bias between the SET and RESET state for the representative population of memory cells.

When a memory device receives a write command, the memory device may determine memory cells that are to be written to a RESET state based on the data indicated by the write command. The memory device may then perform a read operation (e.g., a pre-program read operation) on the memory cells to be written to the RESET state to determine a first set of memory cells currently in a SET state and to determine a second set of memory cells (e.g., within the first set of memory cells) that have a larger threshold voltage in the SET state and are associated with a large voltage drift in the SET state. In some cases, memory cells with a large voltage drift in the SET state are more likely to have a large voltage drift in the RESET state. Further, memory cells are likely to exhibit even larger voltage drifts in the RESET state than the SET state. For example, a difference in threshold voltages between distribution 225-a and 225-b may be smaller than a difference in threshold voltages between distributions 245-a or 255-a and distributions 245-b or 255-b.

In order to determine the first and second sets of memory cells, the memory device may perform the read operation by applying one or more voltages to the memory cells that are to be written to the RESET state. For example, the memory device may apply a ramped voltage (e.g., increasing from a first voltage to a second voltage) to the memory cells. In another example, the memory device may apply a stepped voltage (e.g., a first voltage for a first duration, a second voltage higher than the first voltage for a second duration). The memory device may determine the first set of memory cells (e.g., memory cells currently in the SET state) by applying the read voltage 232. Additionally or alternatively, the memory device may determine the second set of cells (e.g., within the first set of cells that have a large drift voltage in the SET state) by applying the detection voltage 230. In some cases, the memory cells within the first set of memory cells may be memory cells with a threshold voltage less than the read voltage 232 and the memory cells within the second set of memory cells may be memory cells with a threshold voltage between the detection voltage 230 and the read voltage 232. The memory device may further determine a third set of memory cells within the first set of memory cells based on performing the read operation where memory cells within the third set of memory cells have threshold voltages less than the detection voltage.

Based on receiving the write operation, the memory device may apply a write signal to the memory cells to be written from the SET state to the RESET state. In some cases, the memory device may apply a same type of write signal (e.g., a current pulse) to each memory cell to be written from the SET state to the RESET state. Here, the threshold voltages of the memory cells within the first set of memory cells may change from being illustrated by, for example, distribution 225-b to being illustrated by distribution 245-a associated with the RESET state. After a period of time (e.g., 10 seconds (s), 100 s, 1000 s), the threshold voltages of the first set of memory cells may drift and be represented by distribution 245-b. As shown by distribution 245-b, the threshold voltages represented by the upper edge 240-d of distribution 245-b may increase (e.g., drift) in voltage magnitude more than the threshold voltages represented by the lower edge 235-d. As a result, the memory cells represented by the upper edge 240-d of the drifted distribution 245-b may be associated with large threshold voltages. The memory device may consume significantly more energy when reprogramming these memory cells from the RESET state to the SET state when compared to reprogramming a memory cell associated with a lower threshold voltage order.

In some cases, the memory device may determine to selectively apply either a first write signal (e.g., a standard write signal) or a second write signal (e.g., a modified write signal) to each of the memory cells within the first set of memory cells. That is, the memory device may predict a set of memory cells within the first set of memory cells that is likely to exhibit larger voltage drift in the RESET state and apply the modified write signal to those memory cells. In some cases, the memory device may apply the standard write signal to each of the memory cells within the first set of memory cells with a threshold voltage less than the detection voltage 230. The memory device may apply the modified write signal to each of the memory cells within the second set of memory cells with a threshold voltage greater than the detection voltage 230. After applying the write signals (e.g., the standard and modified write signals), the threshold voltages of the memory cells within the first set of memory cells may change from being illustrated by, for example, distribution 225-b to being illustrated by distribution 255-a associated with the RESET state. In some cases, the slope of the distribution 255-a may be greater than the slope of the distribution 245-a. After a period of time (e.g., 10 s, 100 s, 1000 s), the threshold voltages of the first set of memory cells may drift and be represented by distribution 255-b. As shown by distribution 255-b, the threshold voltages represented by the upper edge 240-c of distribution 255-b may increase (e.g., drift) in voltage less than the memory cells written to the RESET state by the standard write signal. Reprogramming these memory cells may consume significantly less energy as a result when compared to reprogramming a memory cell associated with a higher threshold voltage illustrated by distribution 245-b.

Figure 3:
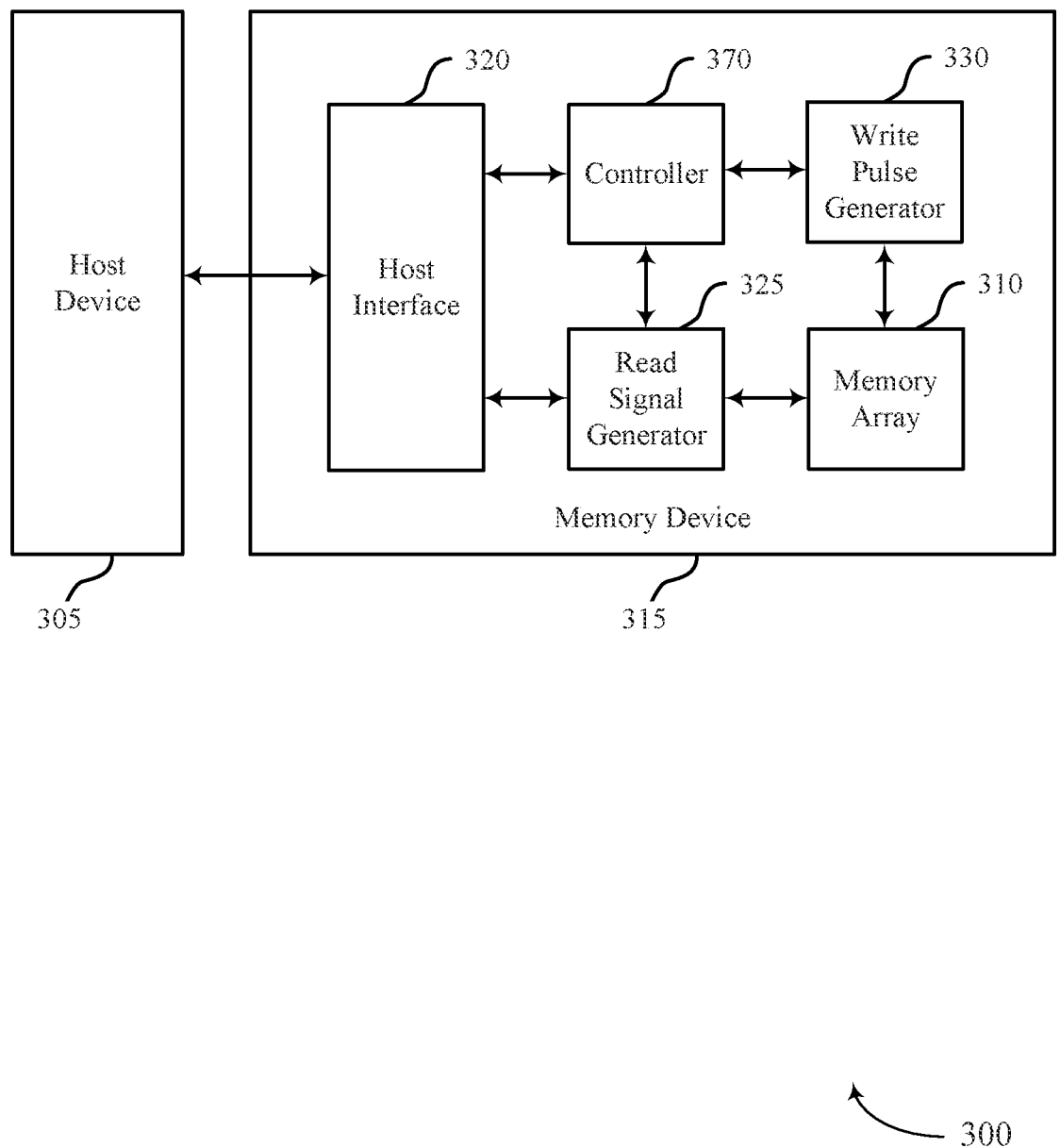
FIG. 3 illustrates an example of a system that supports modified write voltage for memory devices in accordance with examples as disclosed herein.

FIG. 3 illustrates a system 300 that supports a memory device that supports a modified write voltage for memory devices in accordance with examples as disclosed herein. The system 300 may include one or more components described herein with reference to FIG. 1. For example, the system 300 may include a controller 370, which may be an example of the memory controller 170 as described with reference to FIG. 2; and a memory array 310, which may be an example of a memory section 110 as described with reference to FIG. 1. The memory device 315 may also include a host device 305, a memory device 315, a host interface 320, a write read signal generator 325, and a write pulse generator 330.

Host device 305 may send commands to memory device 315. For example, the host device 305 may communicate a write command or a read command to the memory device 315. The host interface 320 may receive commands and data from the host device 305 and communicate the commands and data to the controller 370. The controller 370 may control the operations of the read signal generator 325 to read one or more memory cells within the memory array 310 based on a command received from the host device 305. Additionally, the controller 370 may control the operations of the write pulse generator 330 to write data to one or more memory cells within the memory array 310.

The host device 305 may send a write command to the memory device 315 by the host interface 320. The write command may include a set of data to be written to a set of memory cells within the memory array 310. The host interface 320 may propagate the write command to the controller 370. Based on receiving the write command, the controller 370 may initiate a read operation on a portion of the set of memory cells within the memory array 310 associated with the write operation to the read signal generator 325. For example, the controller 370 may determine the portion of memory cells to be written to a RESET state based on the data included in the write command and indicate the portion of memory cells to the read signal generator 325. The read signal generator 325 may perform a read operation to determine a first set of cells within the portion of memory cells to be written from the SET state to the RESET state. As part of the read operation, the read signal generator 325 may apply a signal to portion of memory cells at a first level to determine which memory cells have a threshold voltage (e.g., a conductance threshold) less than the first level. The first level may correspond to the detection voltage as described with reference to FIG. 2. The read signal generator 325 may also apply a signal at a second level higher than the first level to determine which memory cells have a threshold voltage less than the second level. The second level may correspond to the read voltage as described with reference to FIG. 2.

The controller 370 may determine the first set of memory cells to be written from the SET state to the RESET state based on the read signal generator 325 applying the signal at the second level. For example, each of the memory cells with a threshold voltage less than the second level may be associated with the SET state (e.g., within the first set of cells). The controller 370 may determine a second set of cells within the first set of cells associated with a threshold voltage that exceeds the first level (e.g., the detection voltage) based on the read signal generator 325 applying the signal at the first level. For example, each of the memory cells with a threshold voltage greater than the first level (e.g., the detection voltage) and less than the second level (e.g., the read voltage) may be within the second set of memory cells. The controller 370 may also determine a third set of memory cells within the first set of memory cells associated with a threshold voltage that is less than the first level (e.g., the detection) based on the read signal generator 325 applying the signal at the first level.

The controller 370 may also determine a fourth set of memory cells within the set of memory cells to be reprogrammed from the RESET state to the SET state. For example, the controller 370 may determine the third set of memory cells based on the read signal generator 325 applying the second level (e.g., the read voltage) to memory cells within the memory array 310. In some cases, the controller 370 may determine the memory cells to be reprogrammed from the RESET state to the SET state based on a determining memory cells with a threshold voltage higher than the second level.

The controller 370 may initiate a write operation on the set of memory cells within the memory array 310 associated with the write operation to the read signal generator 325. The write operation may include the controller 370 indicating one or more write pulses to apply to memory cells within the memory array 310. For example, the controller 370 may indicate a write signal and a set of memory cells within the memory array 310 for the write pulse generator 330 to apply the write signal to. The controller 370 may determine a type of write signal to be applied to a memory cell based on a logic state to be stored in the memory cell and a threshold voltage associated with the memory cell. For example, a write signal to write a memory cell from a SET voltage to a RESET voltage may be different from a write signal to write a memory cell from a RESET voltage to a SET voltage. In another example, the controller 370 may determine to apply a modified write signal to a memory cell being switched from the SET state to the RESET state. In some cases, this may decrease a likelihood that the drifted threshold voltage of the memory cell drifts disproportionally higher than other memory cells being switched from the SET state to the RESET state based on the write command received from the host device 305.

The controller 370 may indicate first write signal to the write pulse generator 330 to apply to the third set of memory cells (e.g., the memory cells within the first set of memory cells to be switched from the SET state to the RESET state associated with a threshold voltage less than the detection voltage). In response, the write pulse generator 330 may apply the first write signal to the third set of memory cells within the memory array 310. The controller 370 may indicate a second write signal to the write pulse generator 330 to apply to the second set of memory cells (e.g., the memory cells within the first set of memory cells to be switched from the SET state to the RESET state associated with a threshold voltage greater than the detection voltage). In response, the write pulse generator 330 may apply the second write signal to the second set of memory cells within the memory array 310. The controller 370 may indicate a third write signal to the write pulse generator 330 to apply to the fourth set of memory cells (e.g., the memory cells to be switched from the RESET state to the SET state). In response, the write pulse generator 330 may apply the third write signal to the fourth set of memory cells within the memory array 310.

Figure 4:
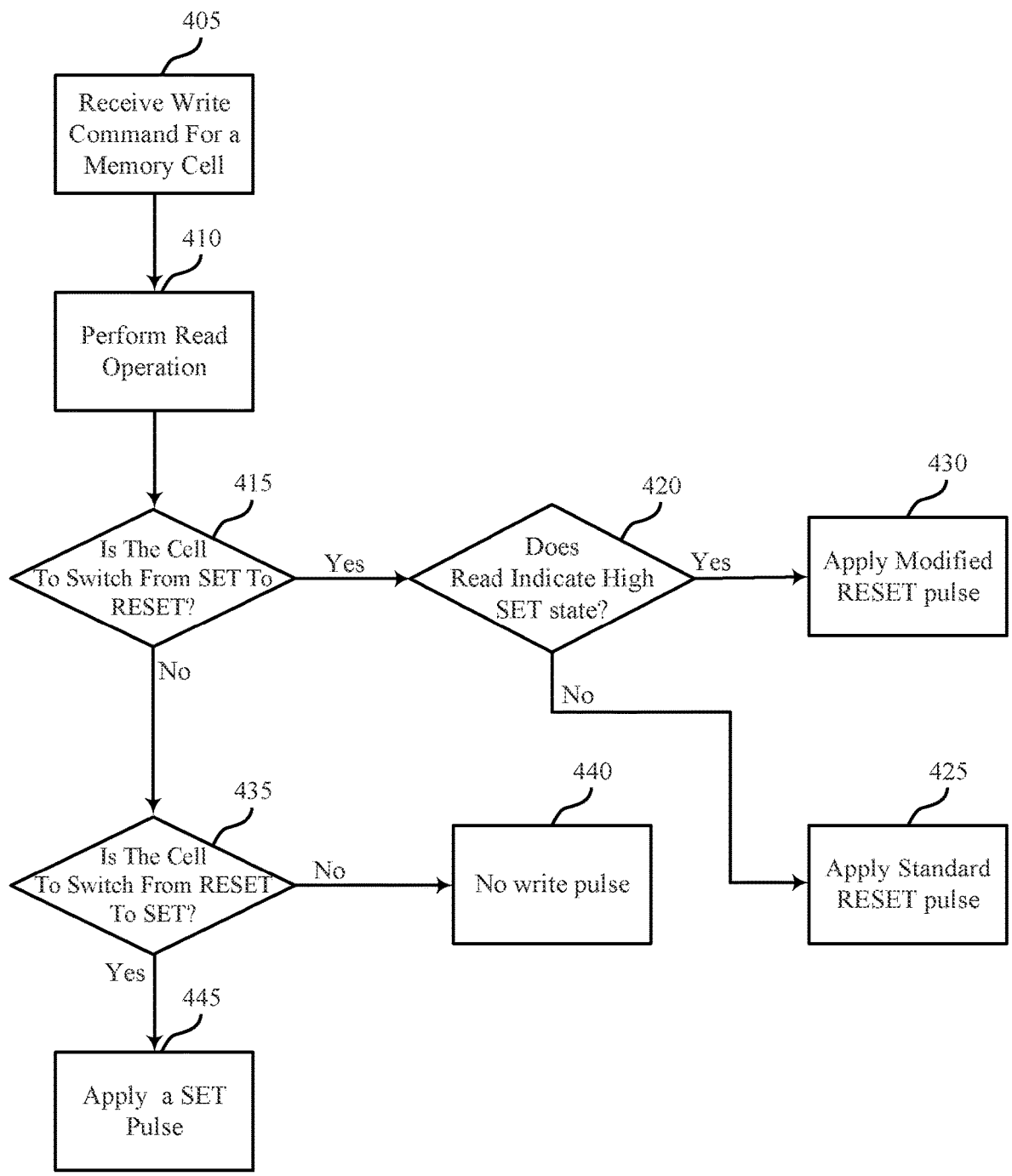
FIG. 4 illustrates an example of a process flow that supports modified write voltage for memory devices in accordance with examples as disclosed herein.

FIG. 4 shows an example diagram of a process flow 400 that supports a modified write voltage for memory devices in accordance with examples as disclosed herein. The features of process flow 400 may be implemented or performed by a memory device (e.g., the memory device 100, the memory device 315 described with reference to FIGS. 1 and 3, among others) or a component of a memory device such as the memory controller 170, the controller 370, the read signal generator 325, or the write pulse generator 330 as described with reference to FIGS. 1 through 3.

At 405, a memory device may receive (e.g., by a host interface as described with reference to FIG. 3) a write command indicating for a memory cell to store a specific logic state. In some cases, the write command may include a set of data (e.g., corresponding to a set of indicated logic states) to be stored across multiple memory cells including the memory cell. The data may indicate whether the memory cell is to be written to a SET state or a RESET state.

At 410 the memory device may perform a read operation on the memory cell. The read operation may include the memory device applying one or more signals (e.g., corresponding to one or more voltage levels) to the memory cell. For example, the memory device may apply a first signal to the memory cell (e.g., by the read signal generator) as part of a read operation to the memory cell. The first signal may correspond to a read voltage and may enable the memory device to determine if the memory cell is in the SET state or a RESET state. In some cases, a controller of the memory device may determine whether the memory cell is in the SET state or the RESET state based on an amount of current that flows through the memory cell while applying the read voltage. For example, if the memory cell has a threshold voltage larger than the read voltage, the controller may determine that the memory cell is storing a RESET state. In another example, if the memory cell has a threshold voltage smaller than the read voltage, the controller may determine that the memory cell is storing a SET state.

At 410, the memory device may further apply a second signal as part of the read operation. For example, the memory device (e.g., by the by the read signal generator as described with reference to FIG. 3) may apply a detection voltage to the memory cell.

At 415, the memory device may determine whether the write command indicates for the memory cell to switch from a SET state to a RESET state based on performing the read operation. For example, at block 405 the controller of the memory device may determine that the memory cell is storing a SET state and the write command indicates a RESET state to be stored at the memory cell. Alternatively, the memory cell may determine that the memory cell is not to be switched from a SET state to a RESET state based on the write command. For example, at 405 the controller may determine that the memory cell is storing a RESET state. In another example, the controller may determine that the memory cell is storing a SET state but the write command indicates for the memory cell to be storing a SET state.

In a first case, the memory device may determine at 415 that the memory cell is not to be switched from the SET state to the RESET state. Here, the memory device may proceed to 435. In a second case, the memory device may determine at 415 that the memory cell is to be switched from the SET state to the RESET state. Here, the memory device may proceed to 420.

At 420, the memory device may determine if the read operation indicates a high SET state of the memory cell. That is, the memory device may determine if the threshold voltage of the memory cell meets a criteria indicating a high SET state of the memory cell. The memory cell may meet the criteria if the memory cell has a threshold voltage that exceeds the detection voltage (e.g., applied at 415). Additionally or alternatively, the memory cell may fail to meet the criteria if the memory cell has a threshold voltage that is less than the detection voltage. The high SET state may indicate that the memory cell is associated with a high threshold voltage in the SET state. That is, the threshold voltage (e.g., a drifted threshold voltage of the memory cell) may be relatively higher than other memory cells within a same memory array storing the SET state. In some cases, there may be a correlation between a high threshold voltage in the SET state and a disproportionally high threshold voltage drift in the RESET state.

In a first case, the memory device may determine at 420 that the read operation does not indicate a high SET state of the memory cell. For example, the memory cell may have a threshold voltage lower than the detection voltage. Here, the memory device may proceed to 425. At 425, the memory device may apply a standard RESET pulse (e.g., by the write pulse generator as described with reference to FIG. 3) to the memory cell, thus switching a state of the memory cell from the SET state to the RESET state. In a second case, the memory device may determine at 420 that the read operation does indicate a high SET state of the memory cell. For example, the memory cell may have a threshold voltage higher than the detection voltage. Here, the memory device may proceed to 430.

At 430, the memory device may apply a modified RESET pulse (e.g., by the write pulse generator as described with reference to FIG. 3) to the memory cell. The modified RESET pulse may, similarly to the standard RESET pulse, switch the memory cell from the SET state to the RESET state. The modified RESET pulse may be modified with respect to the standard RESET pulse. For example, the modified RESET pulse may have a lower amplitude, shorter duration, or other altered characteristic when compared to the standard RESET pulse. The modified RESET pulse may further be associated with decreasing a threshold voltage drift of the memory cell within the RESET state. That is, a memory cell written to the RESET state by a modified RESET pulse may generally exhibit less threshold voltage drift when compared to a memory cell written to the RESET state by a standard RESET pulse.

At 435, the memory device may determine whether the write command indicates for the memory cell to switch from a RESET state to a SET state. For example, at block 405 the controller of the memory device may determine that the memory cell is storing a RESET state and the write command indicates a SET state to be stored at the memory cell. Alternatively, the memory cell may determine that the memory cell is not to be switched from a RESET state to a SET state based on the write command. For example, at 405 the controller may determine that the memory cell is storing a SET state. In another example, the controller may determine that the memory cell is storing a RESET state but the write command indicates for the memory cell to be storing a RESET state.

In a first case, the memory device may determine at 435 that the memory cell is not to be switched from the RESET state to the SET state. Here, the memory device may proceed to 440. At 440, the memory device may complete the execution of the write command for the memory cell by not applying a write pulse to the memory cell (e.g., by via not applying a write pulse between the corresponding word line and bit line). In a second case, the memory device may determine at 410 that the memory cell is to be switched from the RESET state to the SET state. Here, the memory device may proceed to 445. At 445, the memory device may apply a SET pulse to the memory cell to switch the memory cell from the RESET state to the SET state.

Figure 5A:
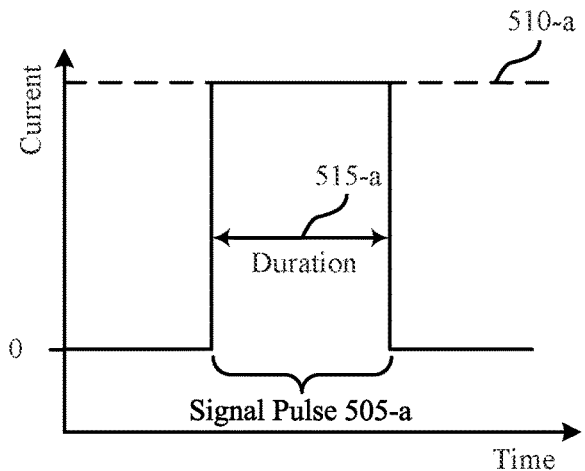
FIGS. 5A-6B illustrate examples of plots of signal pulses that support modified write voltages for memory devices in accordance with examples as disclosed herein.
Figure 5B:
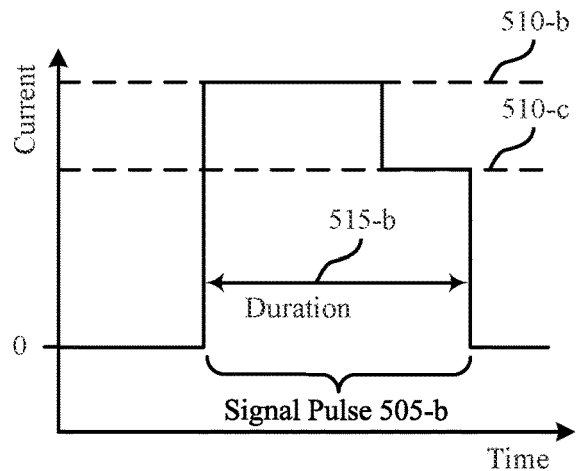
Figure 5C:
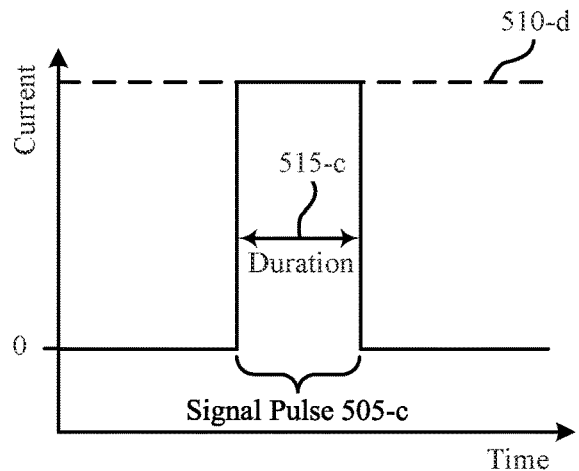

FIGS. 5A through 5C illustrate plots 500 that illustrate example signal pulses 505 that support a modified write voltage for memory devices in accordance with examples as disclosed herein. Each plot 500 may illustrate signal pulses 505 which may be examples of write pulses, write signals, or write voltages, which may be used interchangeably. The illustrated signal pulses 505 may be implemented or performed by a memory device (e.g., the memory device 100, the memory device 315 described with reference to FIGS. 1 and 3, among others) or a component of a memory device such as the memory controller 170, the controller 370, or the write pulse generator 330 as described with reference to FIGS. 1 through 3. Additionally, the signal pulses 505 may be applied to one or more memory cells within a memory section 110 or memory array 310 as described with reference to FIGS. 1 and 3. Signal pulse 505-a may illustrate a standard signal pulse 505 while signal pulses 505-b and 505-c illustrate different examples of possible modified signal pulses 505.

FIG. 5A illustrates plot 500-a that shows signal pulse 505-a. Signal pulse 505-a may be a first write signal, or a standard write signal. A memory device may apply the signal pulse 505-a to a memory cell to switch the state of the memory cell from a SET state to a RESET state. The signal pulse 505-a may have an amplitude 510-a and a duration 515-a.

FIG. 5B illustrates plot 500-b that shows signal pulse 505-b. Signal pulse 505-b may be an example of a second write signal, or a modified write signal. A memory device may apply the signal pulse 505-b to a memory cell to switch the state of the memory cell from a SET state to a RESET state. In some cases, the memory device may apply the signal pulse 505-*b* to a memory cell determined to have a threshold voltage, in the SET state, that meets a criteria such as exceeding a detection voltage. The memory cell may be less likely to exhibit a disproportionally large threshold voltage drift when compared to a threshold voltage drift the memory cell may exhibit in the RESET state after being programmed by a standard write signal such as signal pulse 505-*a*.

The signal pulse 505-*b* may have a first amplitude 510-*b* that may be approximately equal to the amplitude 510-*a* of the signal pulse 505-*a*. The signal pulse 505-*b* may also have a second amplitude 510-*c* after the first amplitude 510-*b* that is less than the first amplitude 510-*c* and the amplitude 510-*a* of the signal pulse 505-*a*. The signal pulse 505-*b* may have a duration 515-*b*. The duration 515-*b* may be the same as a duration 515-*a*, or different than the duration 515-*a*. For example, the duration 515-*b* may be larger than duration 515-*a* or less than duration 515-*a*.

FIG. 5C illustrates plot 500-*c* that shows signal pulse 505-*c*. Signal pulse 505-*c* may be an example of a second write signal, or a modified write signal. A memory device may apply the signal pulse 505-*c* to a memory cell to switch the state of the memory cell from a SET state to a RESET state. In some cases, the memory device may apply the signal pulse 505-*c* to a memory cell determined to have a threshold voltage, in the SET state, that meets a criteria such as exceeding a detection voltage. The memory cell may be less likely to exhibit a disproportionally large threshold voltage drift when compared to a threshold voltage drift the memory cell may exhibit in the RESET state after being programmed by a standard write signal such as signal pulse 505-*a*.

The signal pulse 505-*c* may have a first amplitude 510-*c* that may be approximately equal to the amplitude 510-*a* of the signal pulse 505-*a*. The signal pulse 505-*c* may have a duration 515-*c*. The duration 515-*c* may be the less than the duration 515-*a*.

Figure 6A:
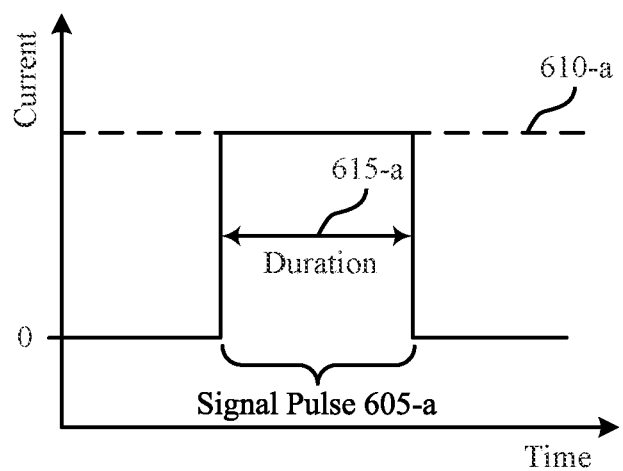
Figure 6B:
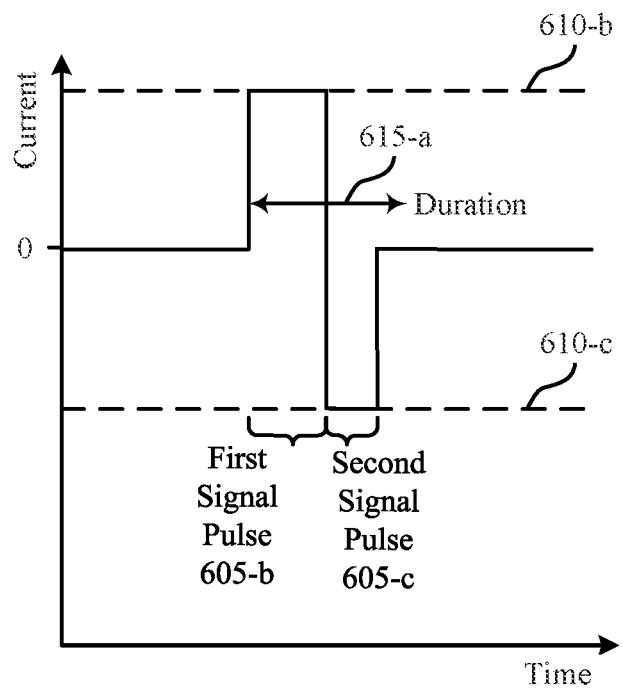

FIGS. 6A through 6B illustrate plots 600 that illustrate example signal pulses 605 that support a modified write voltage for memory devices in accordance with examples as disclosed herein. Each plot 600 may illustrate signal pulses 605 which may be examples of write pulses, write signals, or write voltages, which may be used interchangeably. The illustrated signal pulses 605 may be implemented or performed by a memory device (e.g., the memory device 100, the memory device 315 described with reference to FIGS. 1 and 3, among others) or a component of a memory device such as the memory controller 170, the controller 370, or the write pulse generator 330 as described with reference to FIGS. 1 through 3. Additionally, the signal pulses 605 may be applied to one or more memory cells within a memory section 110 or memory array 310 as described with reference to FIGS. 1 and 3. Signal pulses 605-*a* and 605-*b* may illustrate different examples of possible modified signal pulses 605.

A memory device may apply the signal pulses 605 to a memory cell to switch the state of the memory cell from a SET state to a RESET state. In some cases, the memory device may apply the signal pulses 605 to a memory cell determined to have a threshold voltage, in the SET state, that meets a criteria such as exceeding a determination voltage. The memory cell may be less likely to exhibit a disproportionally large threshold voltage drift when compared to a threshold voltage drift the memory cell may exhibit in the RESET state after being programmed by a standard write signal such as signal pulse 505-*a* as described with reference to FIG. 5A.

FIG. 6A illustrates plot 600-*a* that shows signal pulse 605-*a*. The signal pulse 605-*a* may have an amplitude 610-*a* that may be less than the amplitude 510-*a* of the signal pulse 505-*a* as described with reference to FIG. 5A. For example, the amplitude 610-*a* may be 5 microamps (µA) less than the amplitude 510-*a*. The signal pulse 605-*a* may have a duration 615-*a*. The duration 615-*a* may be the same as a duration 615-*a* or different than the duration 515-*a* (as described with reference to FIG. 5A).

FIG. 6B illustrates plot 600-*b* that shows a first signal pulse 605-*b* followed by a second signal pulse 605-*c*. The first signal pulse 605-*b* may have a first amplitude 610-*c* of a first polarity (e.g., a positive polarity) and the second signal pulse 605-*b* may have a second amplitude 610-*c* of a different polarity. In some cases, the magnitude of each of the signal pulses 605-*b* and 605-*c* may be the same. In some other cases, the magnitude of the second signal pulse 605-*c* may be less than the magnitude of the first signal pulse 605-*b*. The signal pulse 605-*b* may have a duration 615-*b*. The duration 615-*b* may be the same as a duration 515-*a* or different than the duration 515-*a* (as described with reference to FIG. 5A).

Figure 7:
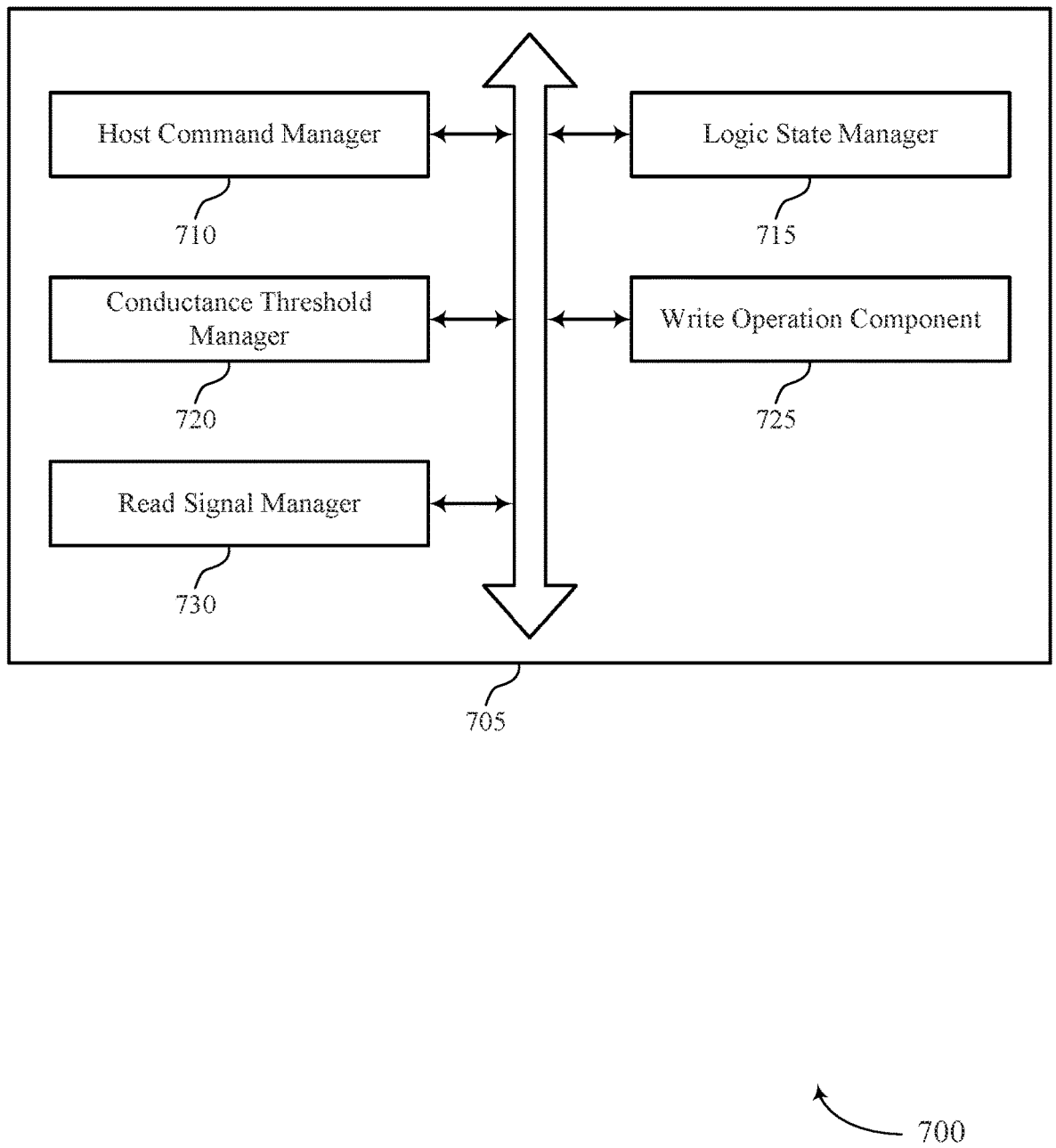
FIG. 7 shows a block diagram of a memory device that supports modified write voltage for memory devices in accordance with aspects of the present disclosure.

FIG. 7 shows a block diagram 700 of a memory device 705 that supports modified write voltage for memory devices in accordance with examples as disclosed herein. The memory device 705 may be an example of aspects of a memory device as described with reference to FIGS. 1 through 6. The memory device 705 may include a host command manager 710, a logic state manager 715, a conductance threshold manager 720, a write operation component 725, and a read signal manager 730. Each of these modules may communicate, directly or indirectly, with one another (e.g., via one or more buses).

The host command manager 710 may receive, from a host device, a write command. The write command may indicate a set of data to be written to a set of memory cells. Additionally or alternatively, the write command may indicate a set of data to be stored at a memory array including the set of memory cells. In some cases, applying the set of levels of a read signal to the set of memory cells is based on receiving the write command.

The logic state manager 715 may determine, based on a read operation on the set of memory cells and the set of data, a first set of memory cells of the set of memory cells to be switched from a first logic state to a second logic state as part of the write command. In some examples, the logic state manager 715 may further determine, based on the read operation on the set of memory cells and the set of data, a third set of memory cells of the set of memory cells to be maintained in a current logic state for the write command. In some examples, the logic state manager 715 may determine, based on applying the set of levels of the read signal to the set of memory cells, that each memory cell within the first set of memory cells is to be switched from the first logic state to the second logic state for the write command.

The conductance threshold manager 720 may determine a second set of memory cells from the first set of memory cells based on the read operation, the second set of memory cells having a conductance threshold in the first logic state satisfying a criteria. In some examples, the conductance threshold manager 720 may determine, based on applying the set of levels of the read signal, a second set of memory cells of the first set of memory cells having a conductance threshold satisfying a criteria. In some cases, the criteria for determining the second set of memory cells is based on a predicted drift of a memory cell storing the second logic state. In some cases, each memory cell within the second set of memory cells satisfies the criteria based on having a conductance threshold that is between the first level of the read signal and the second level of the read signal.

In some cases, the conductance threshold manager 720 may determine a third set of memory cells of the set of memory cells having a conductance threshold in the first logic state that is less than the first level.

The conductance threshold manager 720 may determine that each memory cell of the second set of memory cells has a conductance threshold satisfying the criteria based on the conductance threshold of each memory cell of the second set of memory cells being greater than the first level and less than the second level. In some examples, the conductance threshold manager 720 may determine, based on applying the first level of the read signal, a third set of memory cells of the first set of memory cells that are exclusive of the second set of memory cells and have a conductance threshold within a second range that is less than the first level of the read signal, the third set of memory cells storing the first logic state. The conductance threshold manager 720 may determine that the second set of memory cells of the set of memory cells have respective conductance thresholds that are between the first level and the second level of the read signal based on applying the second level of the read signal.

The write operation component 725 may perform a write operation to write each memory cell within the first set of memory cells from the first logic state to the second logic state based on the write command, where the write operation includes applying a first write signal to write memory cells that are within the first set of memory cells and not within the second set of memory cells and a second write signal to write memory cells that are within the second set of memory cells. In some examples, the write operation component 725 may apply the first write signal and the second write signal to write memory cells is based on receiving the write command.

In some examples, applying the first write signal includes applying a first signal pulse and applying the second write signal includes applying a second signal pulse at a lower current than the first signal pulse. In some cases, applying the first write signal includes applying a first signal pulse and applying the second write signal includes applying a second signal pulse of a shorter duration than the first signal pulse. In some cases, the first write signal and the second write signal each include a first signal pulse of a first polarity. In some cases, the second write signal includes a second signal pulse of a second polarity.

In some instances, performing the write operation may include applying a third write signal to each memory cell within the third set of memory cells to maintain the current logic state of the third set of memory cells. In some examples, the write operation component 725 may apply a first write signal to write memory cells in the first set of memory cells that are exclusive of the second set of memory cells to a second logic state. In some examples, the write operation component 725 may apply a second write signal to write memory cells in the second set of memory cells to the second logic state. In some instances, the write operation component 725 may apply, based on receiving the write command, a first component signal of a first polarity to a first access line associated with a first memory cell from the second set of memory cells.

In some examples, the write operation component 725 may apply, while applying the first component signal to the first access line, a second component signal of a second polarity to a second access line that intersects the first access line and is associated with the first memory cell, where applying the second write signal to write the second set of memory cells is based on applying the first component signal and the second component signal. In some examples, the write operation component 725 may apply, based on receiving the write command and while applying the first component signal and the second component signal, a third component signal of the first polarity to a set of third access lines each intersecting the first access line, the set of third access lines associated with the third set of memory cells.

The read signal manager 730 may apply a set of levels of a read signal to a set of memory cells to determine conductance thresholds associated with a first set of memory cells of the set of memory cells storing a first logic state. In some examples, the read signal manager 730 may apply a signal at a first level to read the set of memory cells based on receiving the write command and performing the read operation. In some examples, the read signal manager 730 may increase the signal from the first level to a second level based on receiving the write command and performing the read operation. In some examples, the read signal manager 730 may apply a first level of the read signal to the set of memory cells, where applying the set of levels of the read signal is based on applying the first level of the read signal. In some examples, the read signal manager 730 may apply, after applying the first level of the read signal, a second level of the read signal greater than the first level of the read signal to the set of memory cells, where applying the set of levels of the read signal is based on applying the second level of the read signal.

Figure 8:
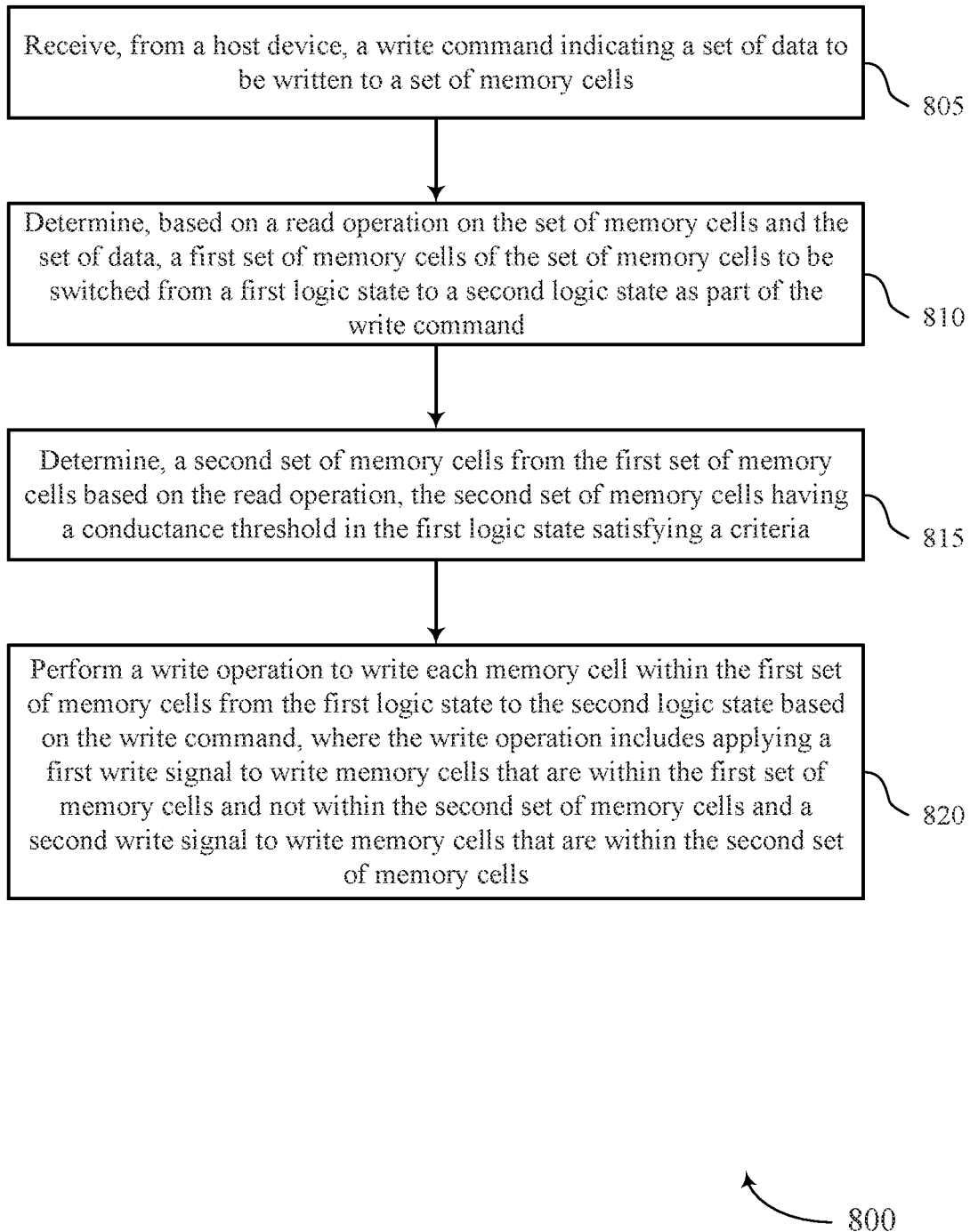
FIGS. 8 and 9 show flowcharts illustrating a method or methods that support modified write voltage for memory devices in accordance with examples as disclosed herein.

FIG. 8 shows a flowchart illustrating a method or methods 800 that supports modified write voltage for memory devices in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may receive, from a host device, a write command indicating a set of data to be written to a set of memory cells. The operations of 805 may be performed according to the methods described herein. In some examples, aspects of the operations of 805 may be performed by a host command manager as described with reference to FIG. 7.

At 810, the memory device may determine, based on a read operation on the set of memory cells and the set of data, a first set of memory cells of the set of memory cells to be switched from a first logic state to a second logic state as part of the write command. The operations of 810 may be performed according to the methods described herein. In some examples, aspects of the operations of 810 may be performed by a logic state manager as described with reference to FIG. 7.

At 815, the memory device may determine a second set of memory cells from the first set of memory cells based on the read operation, the second set of memory cells having a conductance threshold in the first logic state satisfying a criteria. The operations of 815 may be performed according to the methods described herein. In some examples, aspects of the operations of 815 may be performed by a conductance threshold manager as described with reference to FIG. 7.

At 820, the memory device may perform a write operation to write each memory cell within the first set of memory cells from the first logic state to the second logic state based on the write command, where the write operation includes applying a first write signal to write memory cells that are within the first set of memory cells and not within the second set of memory cells and a second write signal to write memory cells that are within the second set of memory cells. The operations of 820 may be performed according to the methods described herein. In some examples, aspects of the operations of 820 may be performed by a write operation component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving, from a host device, a write command indicating a set of data to be written to a set of memory cells, and determining, based on a read operation on the set of memory cells and the set of data, a first set of memory cells of the set of memory cells to be switched from a first logic state to a second logic state as part of the write command. The apparatus may further include feature, means, or instructions for determining a second set of memory cells from the first set of memory cells based on the read operation, the second set of memory cells having a conductance threshold in the first logic state satisfying a criteria, and performing a write operation to write each memory cell within the first set of memory cells from the first logic state to the second logic state based on the write command, where the write operation includes applying a first write signal to write memory cells that are within the first set of memory cells and not within the second set of memory cells and a second write signal to write memory cells that are within the second set of memory cells.

In some examples of the method 800 and the apparatus described herein, applying the first write signal may include operations, features, means, or instructions for applying a first signal pulse and applying the second write signal.

In some cases of the method 800 and the apparatus described herein, applying the first write signal may include operations, features, means, or instructions for applying a first signal pulse and applying the second write signal.

In some instances of the method 800 and the apparatus described herein, the first write signal and the second write signal each include a first signal pulse of a first polarity, and the second write signal includes a second signal pulse of a second polarity.

Some examples of the method 800 and the apparatus described herein may further include operations, features, means, or instructions for applying a signal at a first level to read the set of memory cells based on receiving the write command and performing the read operation, and determining a third set of memory cells of the set of memory cells having a conductance threshold in the first logic state that may be less than the first level.

Some cases of the method 800 and the apparatus described herein may further include operations, features, means, or instructions for increasing the signal from the first level to a second level based on receiving the write command and performing the read operation, and determining that each memory cell of the second set of memory cells may have a conductance threshold satisfying the criteria based on the conductance threshold of each memory cell of the second set of memory cells being greater than the first level and less than the second level.

In some instances of the method 800 and the apparatus described herein, the criteria for determining the second set of memory cells may be based on a predicted drift of a memory cell storing the second logic state.

Some examples of the method 800 and the apparatus described herein may further include operations, features, means, or instructions for determining, based on the read operation on the set of memory cells and the set of data, a third set of memory cells of the set of memory cells to be maintained in a current logic state for the write command, where performing the write operation further includes applying a third write signal to each memory cell within the third set of memory cells to maintain the current logic state of the third set of memory cells.

Some cases of the method 800 and the apparatus described herein may further include operations, features, means, or instructions for applying, based on receiving the write command, a first component signal of a first polarity to a first access line associated with a first memory cell from the second set of memory cells, and applying, while applying the first component signal to the first access line, a second component signal of a second polarity to a second access line that intersects the first access line and may be associated with the first memory cell, where applying the second write signal to write the second set of memory cells may be based on applying the first component signal and the second component signal.

Some examples of the method 800 and the apparatus described herein may further include operations, features, means, or instructions for applying, based on receiving the write command and while applying the first component signal and the second component signal, a third component signal of the first polarity to a set of third access lines each intersecting the first access line, the set of third access lines associated with the third set of memory cells.

Figure 9:
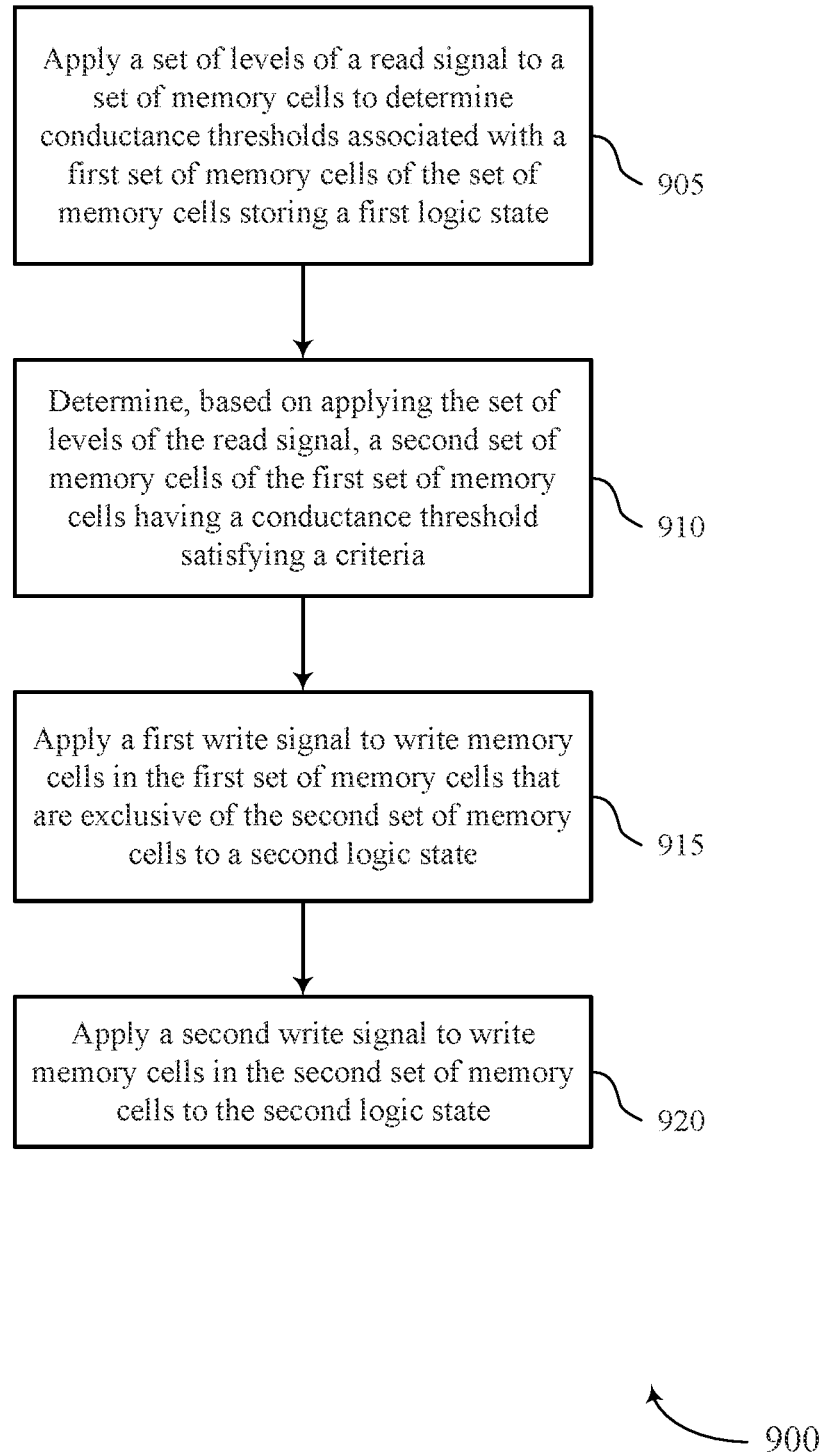

FIG. 9 shows a flowchart illustrating a method or methods 900 that supports modified write voltage for memory devices in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may apply a set of levels of a read signal to a set of memory cells to determine conductance thresholds associated with a first set of memory cells of the set of memory cells storing a first logic state. The operations of 905 may be performed according to the methods described herein. In some examples, aspects of the operations of 905 may be performed by a read signal manager as described with reference to FIG. 7.

At 910, the memory device may determine, based on applying the set of levels of the read signal, a second set of memory cells of the first set of memory cells having a conductance threshold satisfying a criteria. The operations of 910 may be performed according to the methods described herein. In some examples, aspects of the operations of 910 may be performed by a conductance threshold manager as described with reference to FIG. 7.

At 915, the memory device may apply a first write signal to write memory cells in the first set of memory cells that are exclusive of the second set of memory cells to a second logic state. The operations of 915 may be performed according to the methods described herein. In some examples, aspects of the operations of 915 may be performed by a write operation component as described with reference to FIG. 7.

At 920, the memory device may apply a second write signal to write memory cells in the second set of memory cells to the second logic state. The operations of 920 may be performed according to the methods described herein. In some examples, aspects of the operations of 920 may be performed by a write operation component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for applying a set of levels of a read signal to a set of memory cells to determine conductance thresholds associated with a first set of memory cells of the set of memory cells storing a first logic state, determining, based on applying the set of levels of the read signal, a second set of memory cells of the first set of memory cells having a conductance threshold satisfying a criteria, applying a first write signal to write memory cells in the first set of memory cells that are exclusive of the second set of memory cells to a second logic state, and applying a second write signal to write memory cells in the second set of memory cells to the second logic state.

Some examples of the method 900 and the apparatus described herein may further include operations, features, means, or instructions for applying a first level of the read signal to the set of memory cells, where applying the set of levels of the read signal may be based on applying the first level of the read signal, and determining, based on applying the first level of the read signal, a third set of memory cells of the first set of memory cells that may be exclusive of the second set of memory cells and may have a conductance threshold within a second range that may be less than the first level of the read signal, the third set of memory cells storing the first logic state.

Some cases of the method 900 and the apparatus described herein may further include operations, features, means, or instructions for applying, after applying the first level of the read signal, a second level of the read signal greater than the first level of the read signal to the set of memory cells, where applying the set of levels of the read signal may be based on applying the second level of the read signal, and determining that the second set of memory cells of the set of memory cells may have respective conductance thresholds that may be between the first level and the second level of the read signal based on applying the second level of the read signal.

In some instances of the method 900 and the apparatus described herein, each memory cell within the second set of memory cells satisfies the criteria based on having a conductance threshold that may be between the first level of the read signal and the second level of the read signal.

In some examples of the method 900 and the apparatus described herein, applying the first write signal may include operations, features, means, or instructions for applying a first signal pulse to the memory cells in the first set of memory cells that may be exclusive of the second set of memory cells, and applying the second write signal includes applying, to the second set of memory cells, a second signal pulse at a lower current than the first signal pulse.

Some cases of the method 900 and the apparatus described herein may further include operations, features, means, or instructions for receiving, from a host device, a write command indicating a set of data to be stored at a memory array including the set of memory cells, where applying the set of levels of the read signal to the set of memory cells may be based on receiving the write command, and determining, based on applying the set of levels of the read signal to the set of memory cells, that each memory cell within the first set of memory cells may be to be switched from the first logic state to the second logic state for the write command.

Some examples of the method 900 and the apparatus described herein may further include operations, features, means, or instructions for applying the first write signal and the second write signal to write memory cells may be based on receiving the write command.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells that includes a set of memory cells, a host interface, a read signal generator, a controller, and a write pulse generator. The host interface may be coupled with the array of memory cells and configured to receive a write command indicating a set of data to be written to the set of memory cells. The read signal generator may be coupled with the array of memory cells and the host interface and configured to perform a read operation on the set of memory cells based on receiving the write command. The controller may be coupled with the read signal generator and configured to determine, based on the read operation and the set of data, a first set of memory cells of the set of memory cells to be switched from a first logic state to a second logic state for the write command, determine, based on the read operation, a second set of memory cells from the first set of memory cells having a conductance threshold in the first logic state satisfying a criteria. The write pulse generator may be coupled with the array of memory cells and the controller and configured to perform a write operation to write each memory cell within the first set of memory cells from the first logic state to the second logic state according to the write command, where the write operation includes applying a first write signal to write memory cells that are within the first set of memory cells and not within the second set of memory cells and a second write signal to write memory cells that are within the second set of memory cells.

In some examples, the write pulse generator may be further configured to apply the first write signal by applying a first signal pulse, and apply the second write signal by applying a second signal pulse at a lower current than the first signal pulse.

In some cases, the write pulse generator may be further configured to apply the first write signal by applying a first signal pulse, and apply the second write signal by applying a second signal pulse of a shorter duration than the first signal pulse.

In some instances, the first write signal and the second write signal each include a first signal pulse of a first polarity, and the second write signal includes a second signal pulse of a second polarity.

In some examples, the read signal generator may be further configured to apply a read signal at a first level to read the set of memory cells, where performing the read operation may be based on applying the read signal at the first level, and increase the read signal from the first level to a second level.

In some cases, the controller may further be configured to determine that a conductance threshold of each memory cell within the second set of memory cells satisfies the criteria of being greater than the first level and less than the second level, where determining the second set of memory cells may be based on determining that the conductance threshold of each memory cell within the second set of memory cells satisfies the criteria.

Some examples of the apparatus may include a first access line coupled with a first memory cell and a second memory cell, the first memory cell within the first set of memory cells and not within the second set of memory cells, and the second memory cell within the second set of memory cells, a second access line perpendicular to the first access line coupled with the first memory cell, and a third access line perpendicular to the first access line coupled with the second memory cell. Here, the write pulse generator may be further configured to apply, based at least in part on receiving the write command, a first component signal of a first polarity to the first access line, apply, while applying the first component signal to the first access line, a second component signal of a second polarity to the second access line, where applying the first write signal is based on applying the first component signal and applying the second component signal, and apply, while applying the first component signal to the first access line, a third component signal of the second polarity to the third access line.

Some instances of the apparatus may include a fourth access line perpendicular to the first access line coupled with a third memory cell, the third memory cell to be maintained at the second logic state. Here, the write pulse generator may be further configured to apply, while applying the first component signal to the first access line, a fourth component signal of the first polarity to the fourth access line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B. or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving a write command indicating a set of data to be written to a plurality of memory cells; and
performing a write operation based at least in part on the write command, wherein performing the write operation comprises applying a first write signal to a first set of memory cells of the plurality of memory cells that are to be switched from a first logic state to a second logic state as a result of the write command and have a characteristic that does not satisfy a threshold, and applying a second write signal to a second set of memory cells of the plurality of memory cells that are to be switched from the first logic state to the second logic state as a result of the write command and have the characteristic satisfying the threshold.

2. The method of claim 1, further comprising:
performing, based at least in part on receiving the write command, a read operation on the plurality of memory cells, wherein the first set of memory cells and the second set of memory cells are determined based at least in part on performing the read operation.

3. The method of claim 1, wherein:
applying the first write signal comprises applying a first signal pulse; and
applying the second write signal comprises applying a second signal pulse at a lower current than the first signal pulse.

4. The method of claim 1, wherein:
applying the first write signal comprises applying a first signal pulse; and
applying the second write signal comprises applying a second signal pulse of a shorter duration than the first signal pulse.

5. The method of claim 1, wherein:
the first write signal and the second write signal each comprise a first signal pulse of a first polarity; and
the second write signal comprises a second signal pulse of a second polarity.

6. The method of claim 1, wherein the second set of memory cells have the characteristic satisfying the threshold based at least in part on having a conductance threshold in the first logic state that satisfies a criteria.

7. The method of claim 1, wherein the threshold is based at least in part on a predicted drift of a memory cell storing the second logic state.

8. A method, comprising:
applying a plurality of levels of a read signal to a plurality of memory cells to determine respective characteristics associated with the plurality of memory cells;
determining, based at least in part on applying the plurality of levels of the read signal, a set of memory cells of the plurality of memory cells that have the respective characteristics satisfying a threshold and are storing a first logic state; and
applying, to the set of memory cells, a second write signal to write memory cells in the set of memory cells to a second logic state based at least in part on the set of memory cells having the respective characteristics satisfying the threshold, the second write signal different from a first write signal to write memory cells to the second logic state for memory cells having the respective characteristics that do not satisfy the threshold.

9. The method of claim 8, wherein:
applying the first write signal comprises applying a first signal pulse; and
applying the second write signal comprises applying a second signal pulse at a lower current than the first signal pulse.

10. The method of claim 8, wherein:
applying the first write signal comprises applying a first signal pulse; and
applying the second write signal comprises applying a second signal pulse of a shorter duration than the first signal pulse.

11. The method of claim 8, wherein:
the first write signal and the second write signal each comprise a first signal pulse of a first polarity; and
the first write signal comprises a second signal pulse of a second polarity.

12. The method of claim 8, wherein the set of memory cells have the respective characteristics satisfying the threshold based at least in part on having respective conductance thresholds in the first logic state that satisfy a criteria.

13. The method of claim 8, wherein the threshold for determining the set of memory cells is based at least in part on a predicted drift of a memory cell storing the second logic state.

14. The method of claim 8, wherein applying the plurality of levels of the read signal to the plurality of memory cells comprises applying a plurality of steps to the read signal over a plurality of intervals.

15. The method of claim 8, wherein applying the plurality of levels of the read signal to the plurality of memory cells comprises applying a ramp to the read signal over an interval.

16. An apparatus, comprising:
an array of memory cells that includes a plurality of memory cells;
a host interface coupled with the array of memory cells, the host interface configured to receive a write command indicating a set of data to be written to the plurality of memory cells;
a controller coupled with the array of memory cells and the host interface, the controller configured to determine, from the plurality of memory cells, a set of memory cells that have respective characteristics satisfying a threshold and that are to be switched from a first logic state to a second logic state for the write command; and
a write pulse generator coupled with the array of memory cells and the controller, the write pulse generator configured to apply, to the set of memory cells, a second write signal to write memory cells in the set of memory cells to the second logic state based at least in part on the set of memory cells having the respective characteristics satisfying the threshold, the second write signal different from a first write signal to write memory cells to the second logic state for memory cells having the respective characteristics that do not satisfy the threshold.

17. The apparatus of claim 16, further comprising:
a read signal generator coupled with the array of memory cells and the host interface, the read signal generator configured to perform a read operation on the plurality of memory cells based at least in part on receiving the write command, wherein determining the set of memory cells is based at least in part on the performing the read operation.

18. The apparatus of claim 16, wherein, to apply the first write signal, the write pulse generator is further configured to:
to apply the first write signal the write pulse generator is further configured to apply a first signal pulse; and
to apply the second write signal the write pulse generator is further configured to apply a second signal pulse of a lower current than the first signal pulse.

19. The apparatus of claim 16, wherein:
to apply the first write signal the write pulse generator is further configured to apply a first signal pulse; and
to apply the second write signal the write pulse generator is further configured to apply a second signal pulse of a shorter duration than the first signal pulse.

20. The apparatus of claim 16, wherein:
the first write signal and the second write signal each comprise a first signal pulse of a first polarity; and
the first write signal comprises a second signal pulse of a second polarity.

* * * * *